United States Patent
Awada et al.

(10) Patent No.: US 11,877,401 B2
(45) Date of Patent: Jan. 16, 2024

(54) WORK MACHINE, AND CALCULATION METHOD

(71) Applicant: FUJI CORPORATION, Chiryu (JP)

(72) Inventors: Takashi Awada, Nagoya (JP); Satoru Otsubo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 999 days.

(21) Appl. No.: 16/614,699

(22) PCT Filed: May 31, 2017

(86) PCT No.: PCT/JP2017/020175
§ 371 (c)(1),
(2) Date: Nov. 18, 2019

(87) PCT Pub. No.: WO2018/220733
PCT Pub. Date: Dec. 6, 2018

(65) Prior Publication Data
US 2020/0214185 A1 Jul. 2, 2020

(51) Int. Cl.
*H05K 13/08* (2006.01)
*H05K 13/04* (2006.01)
*G05B 19/414* (2006.01)

(52) U.S. Cl.
CPC ....... *H05K 13/0882* (2018.08); *G05B 19/414* (2013.01); *H05K 13/041* (2018.08);
(Continued)

(58) Field of Classification Search
CPC ........... H05K 13/0812; H05K 13/0813; H05K 13/041; H05K 13/0882
See application file for complete search history.

(56) References Cited

U.S. PATENT DOCUMENTS

| | | |
|---|---|---|
| 6,608,320 B1 | 8/2003 | Skunes et al. |
| 6,610,991 B1 | 8/2003 | Case |
| (Continued) | | |

FOREIGN PATENT DOCUMENTS

| | | | | |
|---|---|---|---|---|
| EP | 1 215 954 A1 | 6/2002 | | |
| EP | 2925112 A1 * | 9/2015 | ......... | H05K 13/0812 |
| (Continued) | | | | |

OTHER PUBLICATIONS

Extended European Search Report dated Apr. 2, 2020 in corresponding European Patent Application No. 17911503.5, 8 pages.
(Continued)

*Primary Examiner* — Livius R. Cazan
(74) *Attorney, Agent, or Firm* — Oblon, McClelland, Maier & Neustadt, L.L.P.

(57) ABSTRACT

A work machine including a holding head provided with multiple component holding tools; a moving device configured to move the holding head in a horizontal plane direction and a vertical direction; an imaging device provided with side lighting configured to emit light from a side direction onto leads of the components held by the component holding tools; and a control device, the control device is provided with a first lowering instruction section configured to lower the holding head such that the leads of at least two components held by at least two of the multiple component holding tools enter a lighting range of the side lighting, a first imaging instruction section configured to image the leads of the at least two components based on reflected light of the side lighting that is reflected by the leads of the components.

5 Claims, 10 Drawing Sheets

(52) U.S. Cl.
CPC ..... *H05K 13/0406* (2018.08); *H05K 13/0409* (2018.08); *H05K 13/0812* (2018.08); *H05K 13/0813* (2018.08); *H05K 13/0815* (2018.08); *G05B 2219/35059* (2013.01)

(56) References Cited

U.S. PATENT DOCUMENTS

| | | | |
|---|---|---|---|
| 6,948,232 B1 | 9/2005 | Yazawa et al. | |
| 8,553,080 B2 | 10/2013 | Endo et al. | |
| 2002/0136443 A1* | 9/2002 | Chi | G06T 7/0002 382/291 |
| 2010/0321487 A1 | 12/2010 | Endo et al. | |
| 2017/0034968 A1* | 2/2017 | Yokoyama | H05K 13/0413 |

FOREIGN PATENT DOCUMENTS

| | | | |
|---|---|---|---|
| JP | 2002-529907 A | 9/2002 |
| JP | 2009-206382 A | 9/2009 |
| JP | 2011-228583 A | 11/2011 |
| JP | 2011-253869 A | 12/2011 |

OTHER PUBLICATIONS

International Search Report dated Aug. 29, 2017 in PCT/JP2017/020175 filed May 31, 2017.

* cited by examiner

WORK MACHINE, AND CALCULATION METHOD

TECHNICAL FIELD

The present disclosure relates to a work machine including a holding head having multiple component holders, and a calculation method for calculating a position of a component held by a component holder in the work machine.

BACKGROUND ART

There are work machines provided with a holding head that includes a component holding tool. In such a work machine, as described in the following patent literature, a component held by a component holding tool is imaged by an imaging device, and the position of the component is calculated based on the image data. Then, mounting work or the like of the component is performed using the calculated component position.

CITATION LIST

Patent Literature

Patent literature 1: JP-A-2011-228583
Patent Literature 2: JP-A-2011-253869

BRIEF SUMMARY

Technical Problem

In a work machine configured as above, it is desirable to shorten the time required to image the component held by the component holding tool. The present disclosure takes account of such circumstances, and an object thereof is to shorten the time required for imaging a component held by a component holding tool.

Solution to Problem

To solve the above problems, a work machine of the present disclosure includes: a holding head provided with multiple component holding tools; a moving device configured to move the holding head in a horizontal plane direction and a vertical direction; an imaging device provided with side lighting configured to emit light from a side direction onto leads of the components held by the component holding tools; and a control device, wherein the control device is provided with a first lowering instruction section configured to lower the holding head such that the leads of at least two components held by at least two of the multiple component holding tools enter a lighting range of the side lighting, a first imaging instruction section configured to image the leads of the at least two components based on reflected light of the side lighting that is reflected by the leads of the components, and a first calculating section configured to calculate a position of the leads of the at least two components based on image data imaged by the first imaging instruction section.

Advantageous Effects

According to the present disclosure, by lowering the holding head that includes multiple component holders, it is possible to collectively image the leads of two or more components held by the multiple component holders. This makes it possible to shorten the time required for imaging components held by the component holding tools.

DESCRIPTION OF EMBODIMENTS

Figure 1:
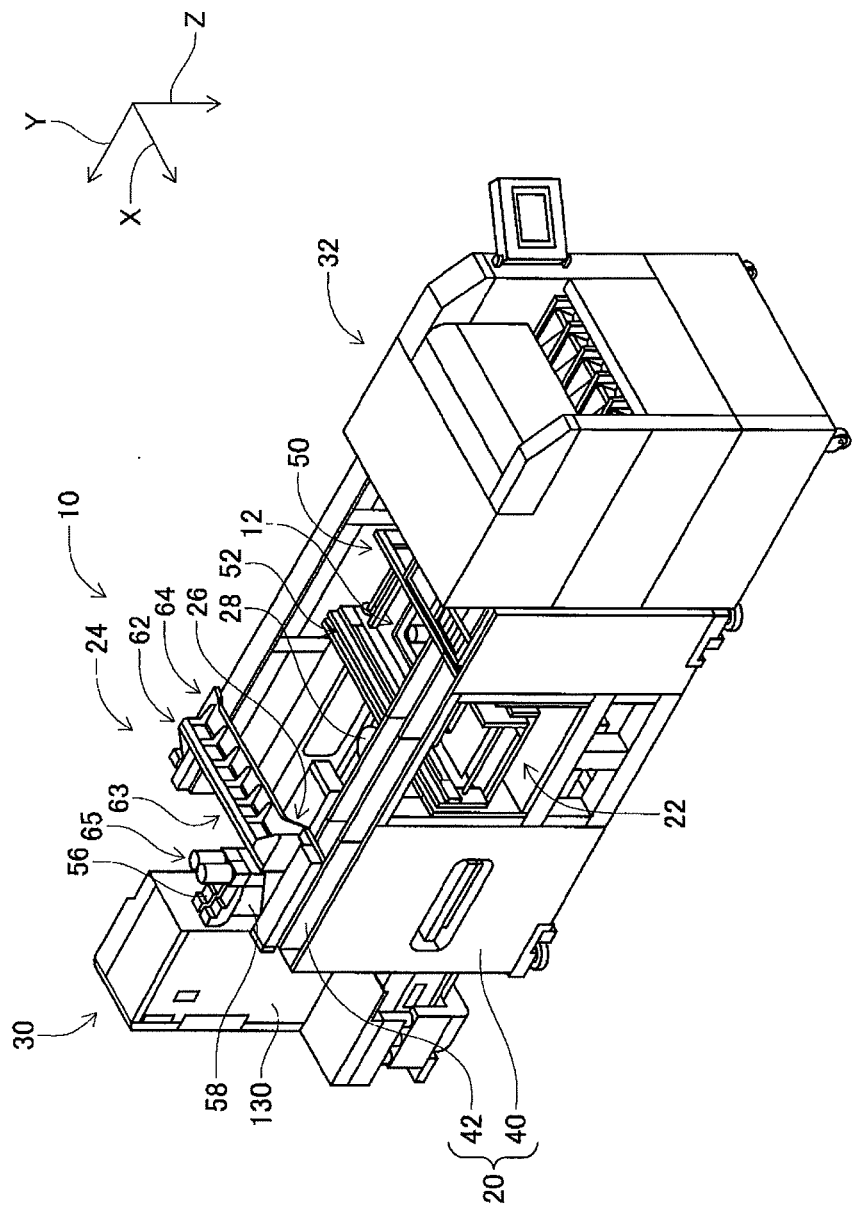
FIG. 1 is a perspective view of a component mounter.

The following describes in detail referring to the figures an example embodiment of the present disclosure.
(A) Configuration of Component Mounter FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, and control device (refer to FIG. 6) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Component mounting device 24 is provided on beam section 42, and includes work heads 56 and 58 and work head moving device 62. Work head moving device 62 includes X-direction moving device 63, Y-direction moving device 64, and Z-direction moving device 65. X-direction moving device 63 and Y-direction moving device 64 each have an electromagnetic motor (see FIG. 6) 66, 68, and operation of each electromagnetic motor 66, 68 moves the two working heads 56, 58 together to any position on frame section 40. Also, Z-direction moving device 65 has electromagnetic motors (see FIGS. 6) 70 and 72, and sliders 74 and 76 are individually moved in the vertical direction by operation of electromagnetic motors 70 and 72. Further, work heads 56, 58 are detachably mounted on sliders 74, 76.

As a result, work heads 56 and 58 are individually moved in the vertical direction by Z-direction moving device 65.

Figure 3:
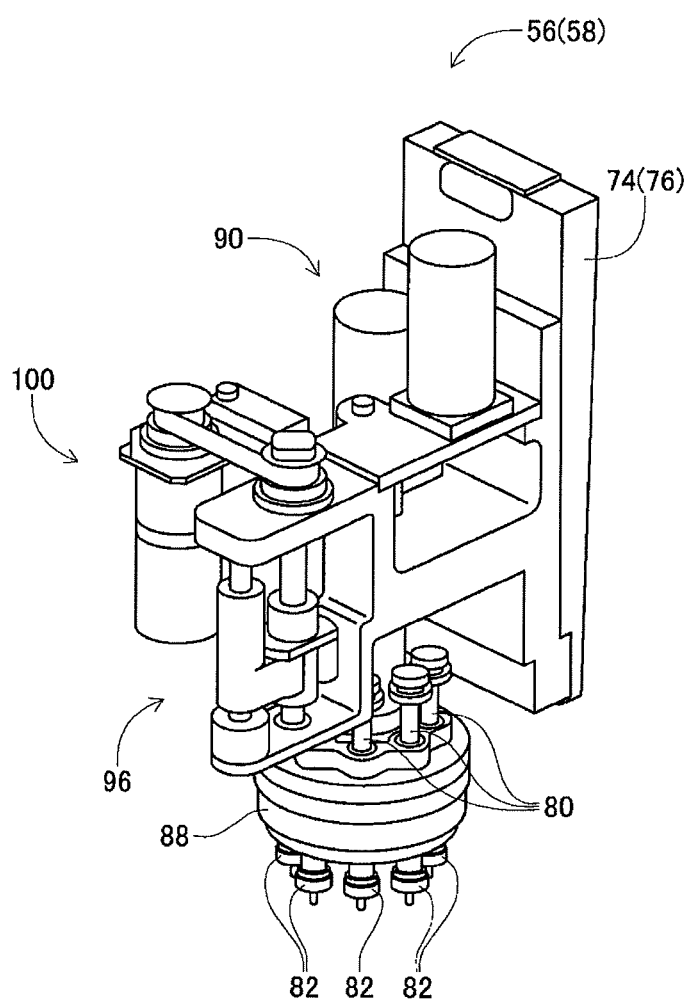
FIG. 3 is a perspective view of a work head.

Also, work heads 56 and 58 are for mounting components on circuit board 12. As shown in FIG. 3, heads 56 and 58 include eight rod-shaped mounting units 80. A suction nozzle 82 is attached to the tip section of each of the eight mounting units 80. Note that, in FIG. 3, work heads 56 and 58 are shown with covers removed.

Figure 4:
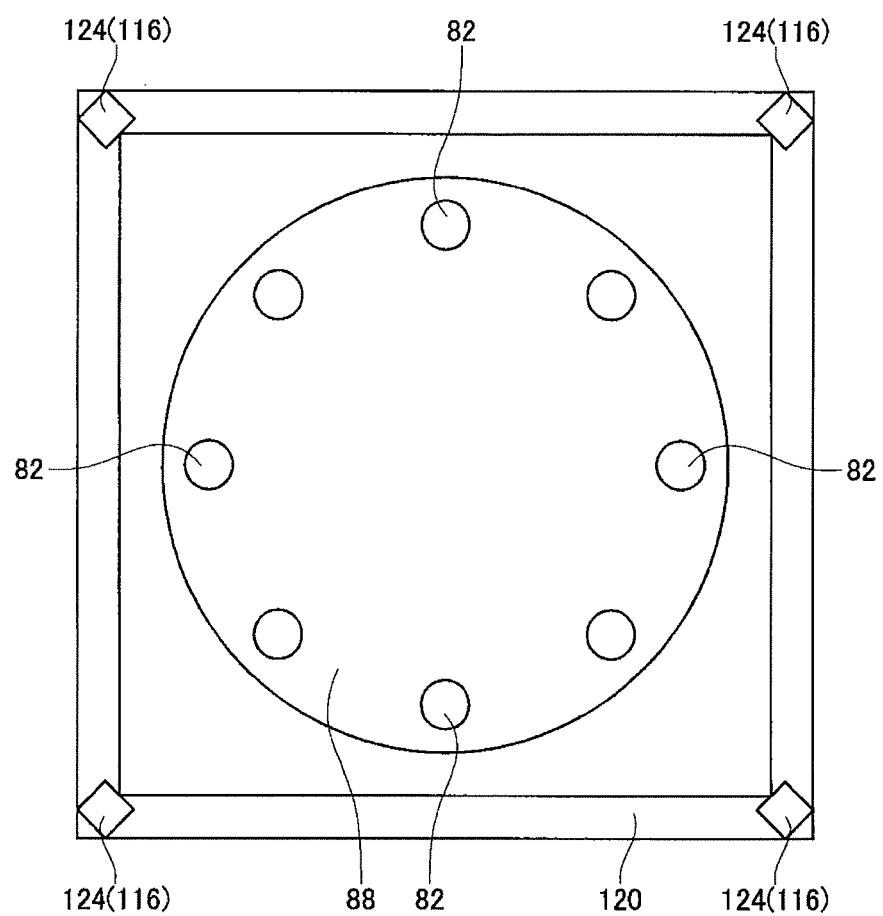
FIG. 4 shows the bottom side of the work head.

Suction nozzle 82 is connected to positive and negative pressure supply device (refer to FIG. 6) 86 via a negative pressure air and positive pressure air supply passage. Suction nozzle 82 picks up and holds a component using negative pressure, and releases the held component using positive pressure. Further, the eight mounting units 80 are held at an equal angular pitch on the outer periphery of the unit holding body 88 so that their axial directions are perpendicular, and suction nozzles 82 extend downward from the lower surface of unit holding body 88. Thus, as shown in FIG. 4, suction nozzles 82 are arranged at eight evenly spaced positions.

Also, as shown in FIG. 3, unit holding body 88 is intermittently rotated by a fixed angle of mounting unit 80 each time by electromagnetic motor (see FIG. 6) 92 of holding body rotating device 90. Thus, mounting units 80 are stopped sequentially at a raising and lowering station (the station positioned furthest to the front) that is one stopping position of the stopping positions of the multiple mounting units 80. The mounting unit 80 positioned at the raising and lowering station is raised and lowered by electromagnetic motor (refer to FIG. 6) 98 of unit raising and lowering device 96. As a result, the vertical position of the component held by suction nozzle 82 is changed. Further, a stopping position different from the raising and lowering station is a rotation station, and the mounting unit 80 located at the rotation station is rotated around its own axis by electromagnetic motor (see FIG. 6) 102 of rotation device 100. As a result, the pickup orientation of the component held by suction nozzle 82 is changed.

Figure 2:
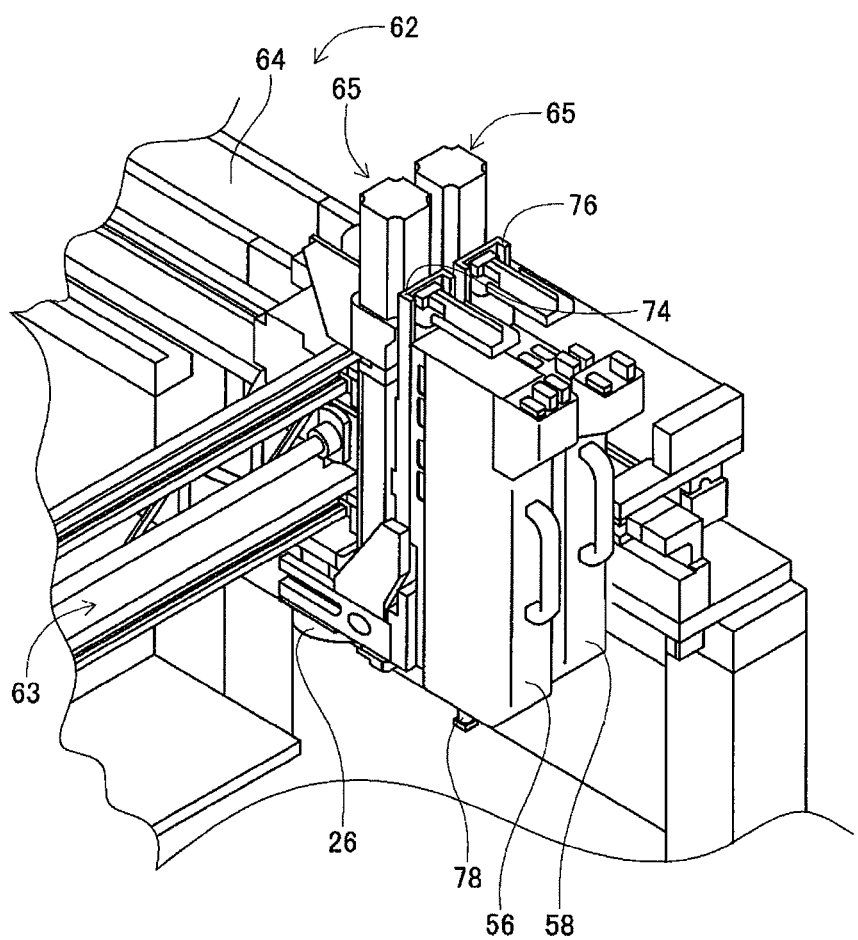
FIG. 2 is a perspective view of a component mounting device of the component mounter.

Further, as shown in FIG. 2, mark camera 26 is attached to slide 74 in a state facing downwards, and is moved in the X direction, Y direction, and Z direction together with work head 56. Thus, mark camera 26 images any position on frame section 40. Also, as shown in FIG. 1, component camera 28 is provided in a state facing upwards on frame section 40 between board conveying and holding device 22 and component supply device 30. Thus, component camera 28 images a component held by suction nozzle 82 of work heads 56 or 58. Note that, with component camera 28, imaging is performed by light emitted from a light source of either side lighting or incident lighting.

Figure 5:
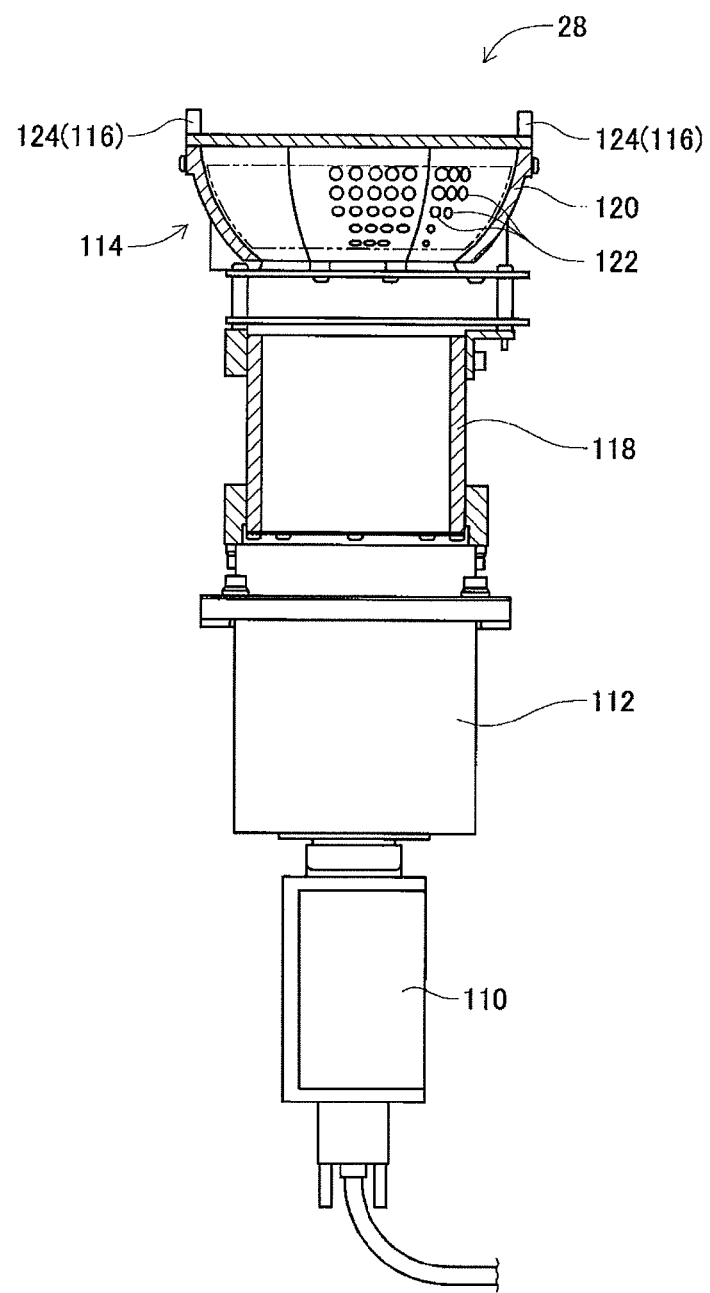
FIG. 5 is a cross section of a component camera.

In detail, as shown in FIG. 5, component camera 28 is provided with imaging device 110, lens 112, incident lighting 114, and side lighting 116. Imaging device 110 includes an imaging element (not shown) arranged with its light-receiving surface facing up. Lens 112 is fixed at the light-receiving surface side of imaging device 110, that is, on the upper side, and incident lighting 114 is arranged above lens 112 via box-shaped member 118. Incident lighting 114 includes an approximately annular-shaped shell member 120, with shell member 120 formed in a shape extending further upwards towards the outer edge. That is, shell member 120 has a shape like a bowl with the bottom portion removed, and is arranged at the upper end section of box-shaped member 118 with the smaller inner diameter side of shell member 120 towards box-shaped member 118.

Multiple LED lights 122 are provided inside shell member 120, and the multiple LED lights 122 emit incident light upward.

Side lighting 116 is configured from four laser lights 124 (only two are shown in the figure). The four laser lights 124 are arranged at four equally spaced positions on the circumference of the upper edge of shell member 120 of incident lighting 114. The four laser lights 124 emit side light toward the center of the upper edge of the shell member 120 in a substantially horizontal direction. The incident light from incident lighting 114 or the side light from side lighting 116 reflects off the component that is the imaging target and hits lens 112. Then, light hitting lens 112 enters imaging device 110 and is detected by the imaging element of imaging device 110. Thus, the component that is the target for imaging is imaged by component camera 28.

As shown in FIG. 1, component supply device 30 is provided at an end of frame section 40 in the front-rear direction. Component supply device 30 includes tray-type component supply device 130 and feeder-type component supply device (refer to FIG. 6) 132. Tray-type component supply device 130 supplies components in a state arranged in a tray. Feeder-type component supply 132 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Note that, components supplied by component supply device 30 and loose component supply device 32 may include electronic circuit components, configuration components of solar panels, configuration components of power modules, and the like. Also, electronic circuit components include components with leads and components without leads.

Figure 6:
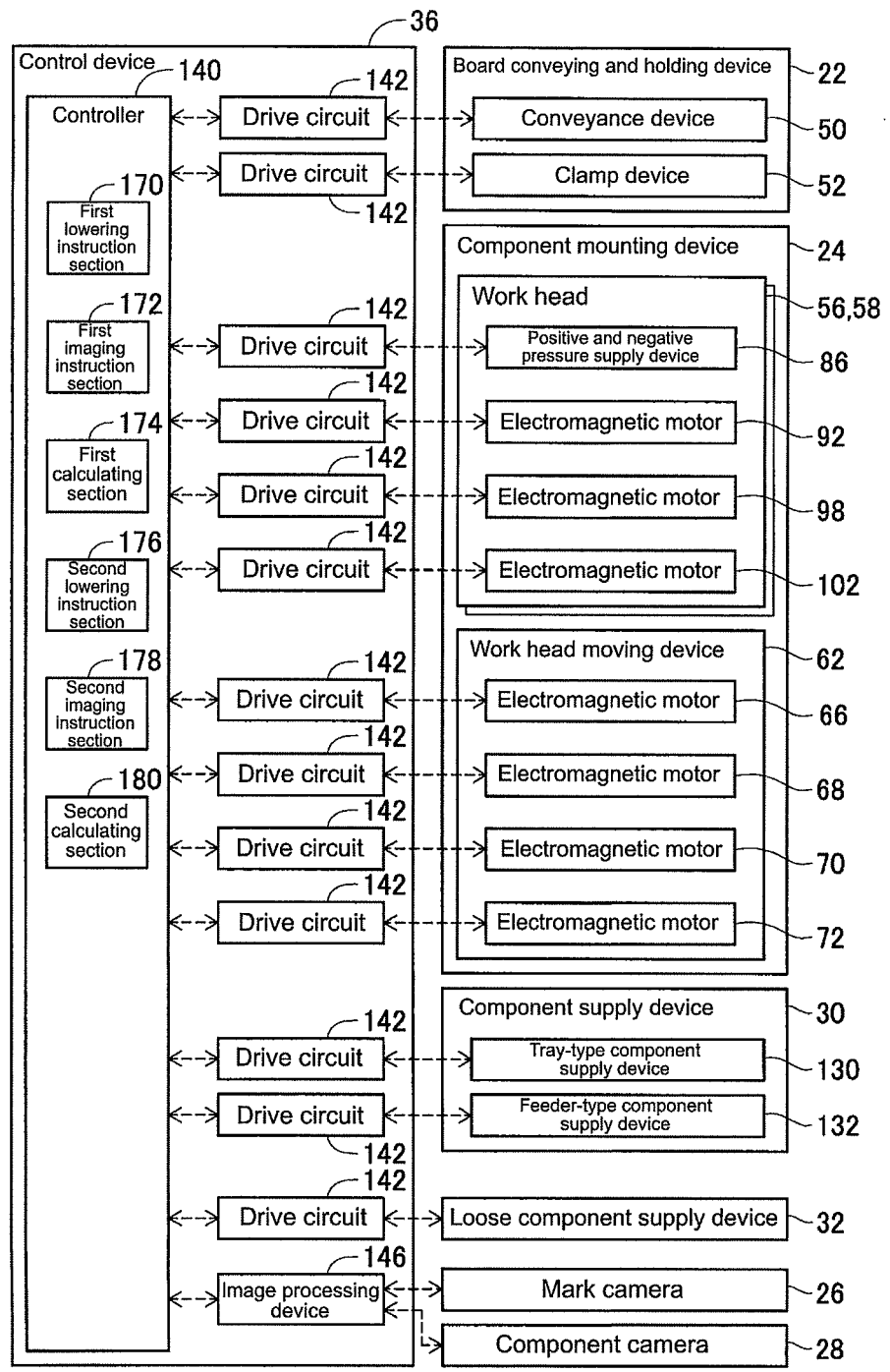
FIG. 6 is a block diagram showing a control device.

As shown in FIG. 6, control device 36 is provided with controller 140, multiple drive circuits 142, and image processing device 146. The multiple drive circuits 142 are connected to conveyance device 50, clamp device 52, electromagnetic motors 66, 68, 70, 72, 92, 98, and 102, positive and negative pressure supply device 86, tray-type component supply device 130, feeder-type component supply device 132, and loose component supply device 32. Controller 140 is provided with a CPU, ROM, RAM, and so on, is formed mainly from a computer, and is connected to the multiple drive circuits 142. By this, operation of board conveying and holding device 22, component mounting device 24, and so on is controlled by controller 140. Controller 140 is also connected to image processing device 146. Image processing device 146 is for processing image data acquired by mark camera 26 and component camera 28, and controller 140 acquires various information from the image data.

(B) Component Mounter Operation

Component mounter 10, according to the above configuration, mounts components on circuit board 12 held by board conveying and holding device 22. With component mounter 10, it is possible to mount various components to circuit board 12, but descriptions are given below of a case in which leaded components 150 (refer to FIG. 7) are mounted on circuit board 12.

Specifically, circuit board 12 is conveyed to a work position, and is fixedly held at that position by clamp device 52. Next, mark camera 26 moves above circuit board 12 and images circuit board 12. Controller 140 calculates the positional coordinates or the like of the insertion holes (not shown) formed in circuit board 12 in the X and Y directions, based on the captured image data.

Figure 7:
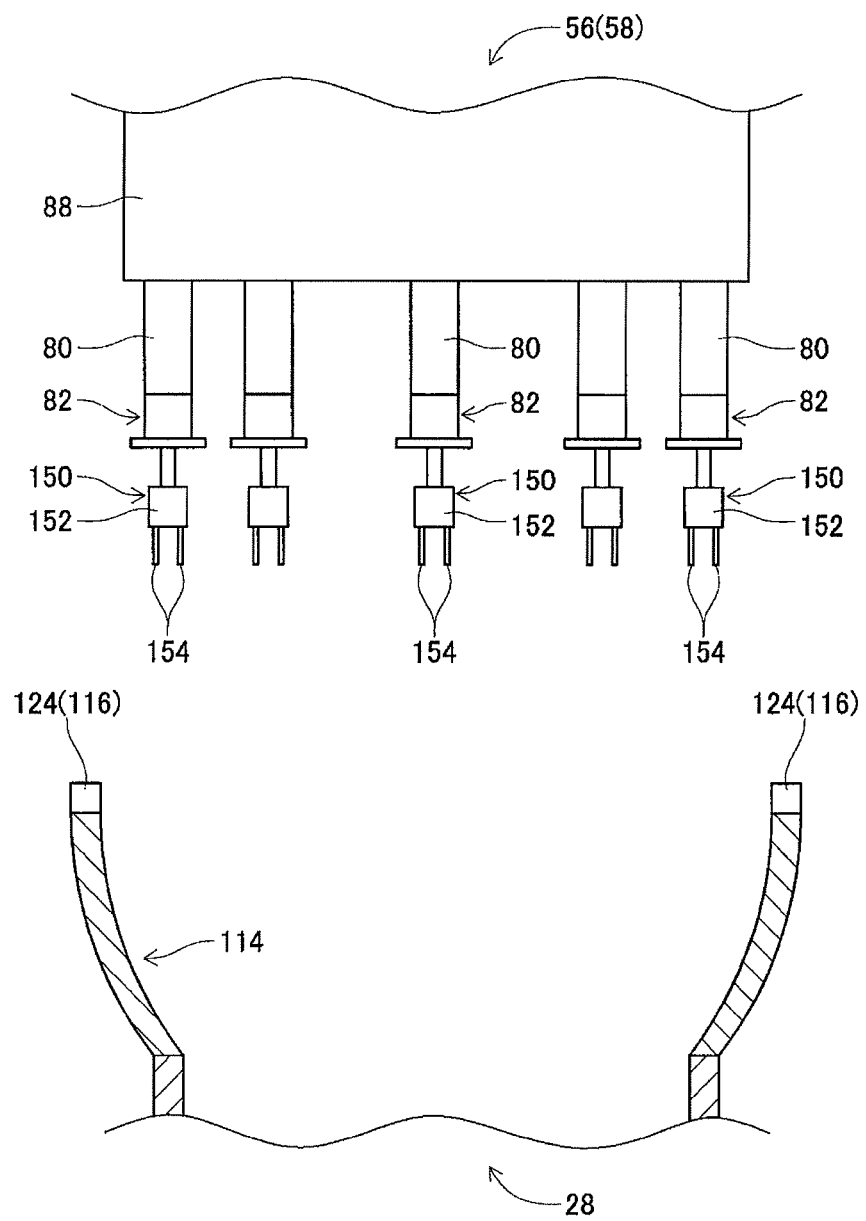
FIG. 7 illustrates operation of a work head during imaging of leaded components.

Also, component supply device 30 or loose component supply device 32 supplies leaded components 150 at a specified supply position. Then, by moving one of the work heads 56 or 58 above the component supply position and lowering the mounting unit 80 positioned at the raising and lowering station of the work head 56 or 58, suction nozzle 82 of that mounting unit 80 picks up and holds leaded component 150. Note that, as shown in FIG. 7, suction nozzle 82 picks up and holds leaded component 150 at the upper surface of component main body 152 of leaded component 150.

Next, working head 56, 58 is moved over component camera 28, and leaded component 150 held by suction nozzle 82 is imaged by component camera 28. Then, controller 140 calculates the position coordinates of the leading ends of leads 154 of leaded component 150 held by suction nozzle 82 in the X and Y directions based on the captured image data.

Subsequently, at work head 56, 58, operation of rotation device 100 is controlled such that leads 154 of leaded component 150 held by suction nozzle 82 of mounting unit 80 positioned at the rotation station can be inserted into insertion holes of circuit board 12. As a result, at the rotation station of operation head 56, 58, mounting unit 80 rotates such that the arrangement direction of the leads 154 of leaded component 150 coincides with the arrangement direction of the insertion holes of circuit board 12. Next, operation of work head moving device 62 is controlled such that the position coordinates in the X and Y directions of the leading ends of leads 154 of leaded component 150 held by suction nozzle 82 of mounting unit 80 positioned at the raising and lowering station coincide with the position coordinates in the X and Y directions of the insertion holes of circuit board 12. As a result, the leading ends of leads 154 of leaded component 150 held by suction nozzle 82 of mounting unit 80 located at the raising and lowering station coincide with the insertion holes of circuit board 12 in the vertical direction.

Then, operation of unit raising and lowering device 96 is controlled, and mounting unit 80 at the raising and lowering station is lowered. As a result, leads 154 of leaded component 150 are inserted into insertion holes of circuit board 12, such that leaded component 150 is mounted on circuit board 12.

(C) Imaging of Leaded Components by Component Camera

As described above, with component mounter 10, leaded component 150 supplied by component supply device 30 or the like is held by suction nozzle 82, and the held leaded component 150 is imaged. Then, the position coordinates of the leading ends of leads 154 in the X and Y directions are calculated based on the image data, and leads 154 are inserted into insertion holes of circuit board 12 using the calculated position coordinates of the leading ends of leads 154. Further, work head 56, 58 has eight suction nozzles 82 so as to be able to hold eight leaded components 150 supplied from component supply device 30 or the like using the eight suction nozzles 82. Thus, with component mounter 10, mounting operation of eight leaded components 150 can be performed continuously, and the cycle time can be shortened.

Figure 8:
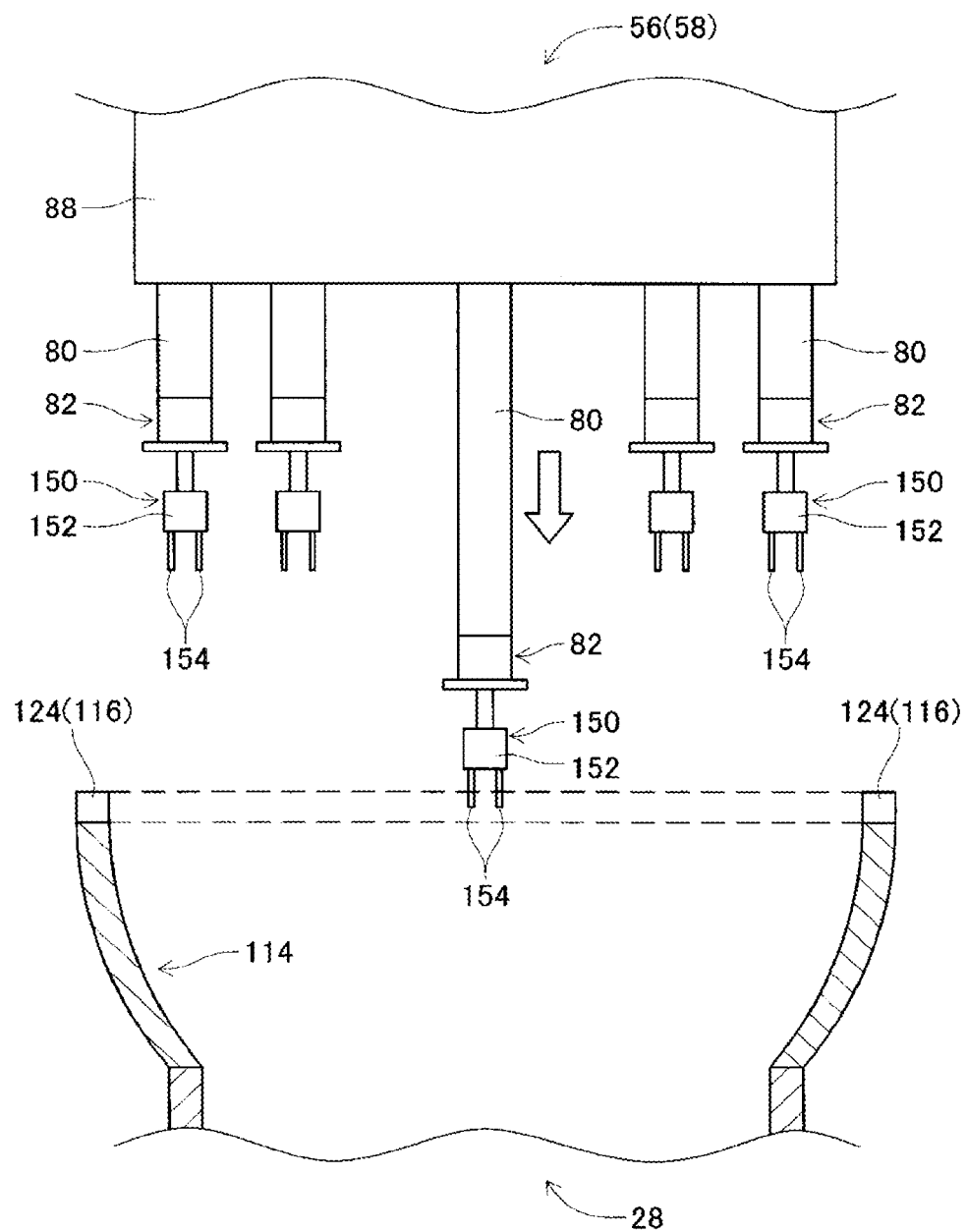
FIG. 8 illustrates conventional operation of a work head during imaging of leaded components.

However, in a conventional component mounter, since the multiple leaded components 150 held by the multiple suction nozzles 82 are imaged individually, the cycle time cannot be sufficiently shortened. In detail, when a leaded component 150 held by suction nozzle 82 is imaged, work head 56, 58 moves above component camera 28 by the operation of X-direction moving device 63 and Y-direction moving device 64 of work head moving device 62, as shown in FIG. 7. Then, mounting unit 80 positioned at the raising the lowering station is lowered by operation of unit raising and lowering device 96, as shown in FIG. 8. Here, operation of unit raising and lowering device 96 is controlled such that the leading ends of leads 154 of leaded component 150 held by suction nozzle 82 of mounting unit 80 fall within the lighting range (the range indicated by the dotted line in the drawing) of side lighting 116. Note that, with component camera 28, only side lighting 116 is turned on; incident lighting 114 is turned off.

In this manner, since the leading ends of leads 154 of leaded component 150 fall within the lighting range of side lighting 116, the light of side lighting 116, that is, the laser light of laser lights 124 is reflected by the leading ends of leads 154, and the reflected light enters imaging device 110 of component camera 28. As a result, the leading ends of leads 154 are imaged by imaging device 110. Then, controller 140 calculates the position coordinates of the leading ends of leads 154 in the X and Y directions based on the image data obtained by the imaging.

Further, when the imaging of leaded component 150 held by suction nozzle 82 of the mounting unit 80 positioned at the raising and lowering station is completed, the mounting unit 80 is raised by the operation of unit raising and lowering device 96. Then, unit holding body 88 holding mounting unit 80 rotates by the arrangement angle of mounting unit 80. As a result, mounting unit 80 of suction nozzle 82 holding the leaded component 150 that has been imaged is moved to a station adjacent to the raising and lowering station, and the mounting unit 80 of the suction nozzle 82 holding a leaded component 150 that has not been imaged is moved to the raising and lowering station. Then, the mounting unit 80 that has been moved to the raising and lowering station is lowered by operation of unit raising and lowering device 96, and the leaded component 150 held by suction nozzle 82 of that mounting unit 80 is imaged in accordance with the above-described procedures.

In this manner, in a conventional component mounter, the positions of the leading ends of leads 154 of one leaded component 150 are calculated by a series of operations of lowering the mounting unit 80 positioned at the raising and lowering station, imaging the leaded component 150 held by suction nozzle 82 of that mounting unit 80, and raising the mounting unit 80. In other words, when eight leaded components 150 are held by eight suction nozzles 82, by repeating the series of operations of lowering mounting unit 80, capturing an image of the leaded component 150, and raising the mounting unit 80 eight times, the positions of the leading ends of leads 154 of the eight leaded components 150 are calculated. As described above, if the series of operations of lowering of mounting unit 80, imaging of leaded component 150, and raising of mounting unit 80 are repeatedly performed eight times, the cycle time cannot be sufficiently shortened.

Figure 9:
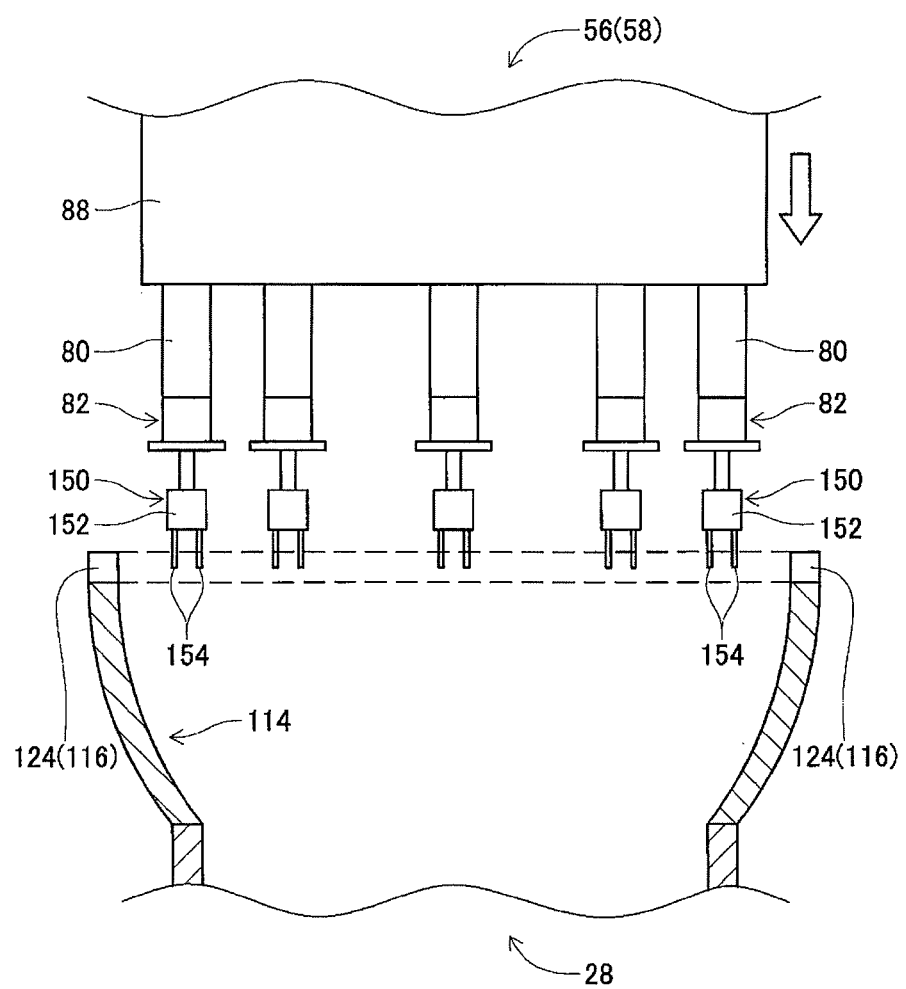
FIG. 9 illustrates operation of a work head during imaging of leaded components for the present disclosure.

In view of this, with component mounter 10, work head 56, 58 holding the eight mounting units 80, that is, work head 56, 58 holding the eight leaded components 150 is lowered, and the eight leaded components 150 are collectively imaged. In detail, after work head 56, 58 is moved above component camera 28 by operation of the X-direction moving device 63 and Y-direction moving device 64 of work head moving device 62, the work head 56, 58 is lowered by operation of Z-direction moving device 65, as shown in FIG. 9. Here, operation of Z-direction moving device 65 is controlled such that the leading ends of leads 154 of leaded components 150 held by suction nozzles 82 fall within the lighting range (the range indicated by the dotted line in the drawing) of side lighting 116.

Further, with work head 56 and 58, as shown in FIG. 4, operation of holding body rotating device 90 is controlled such that the four suction nozzles 82 positioned at four equally spaced positions of the eight suction nozzles 82 of work head 56, 58 and the four laser lights 124 of side lighting 116 face each other in the X and Y directions. As a result, by a single laser light 124, leads 154 of leaded component 150 held by the suction nozzle 82 facing the laser light 124, and leads 154 of leaded components 150 held by suction nozzles 82 adjacent to that suction nozzle 82 are irradiated with laser light. Thus, laser light is irradiated on leads 154 of the eight leaded components 150 by the four laser lights 124 without generating a shadow.

Then, when the lowering of work head 56, 58 and the rotating of unit holding body 88 of work head 56, 58 are completed, imaging device 110 of component camera 28 performs imaging. That is, leads 154 of the eight leaded components 150 are irradiated with laser light, and the laser light is reflected by the leads 154 of the respective leaded components 150. Then, by the reflected light entering imaging device 110 of component camera 28, the leading ends of leads 154 of each leaded component 150 are imaged by imaging device 110. That is, leads 154 of the eight leaded components 150 held by the eight suction nozzles 82 of work head 56, 58 are imaged collectively. Then, controller 140 calculates the position coordinates in the X and Y directions of the leading ends of leads 154 of the eight leaded components 150 based on the image data obtained by the imaging. When the imaging of leaded components 150 is completed, work head 56, 58 is raised by the operation of Z-direction moving device 65.

In this manner, with component mounter 10, when leaded components 150 held by suction nozzles 82 are imaged, work head 56, 58 is lowered, and the multiple leaded components 150 held by the multiple suction nozzles 82 of work operation head 56, 58 are imaged collectively. In other words, with component mounter 10, a series of operations of lowering work head 56, 58, imaging the multiple leaded components 150 held by the multiple suction nozzles 82 of work head 56, 58, and raising work head 56, 58 are performed only once, and the positions of the leading ends of leads 154 of up to eight leaded components 150 are calculated. As a result, the time required for imaging leaded components 150 held by suction nozzles 82 can be shortened, and the cycle time can be shortened.

Further, Z-direction moving device 65 for moving work head 56, 58 in the vertical direction uses electromagnetic motor 70, 72 as a drive source, and electromagnetic motor 70, 72 as a servo motor. Therefore, work head 56, 58 can be lowered to any position by the operation of Z-direction moving device 65. As a result, during imaging of leaded components 150 held by suction nozzles 82, the leading ends of leads 154 of leaded components 150 of various sizes can be appropriately placed in the lighting range of side lighting 116, such that leaded components 150 of various sizes can be appropriately imaged collectively.

Figure 10:
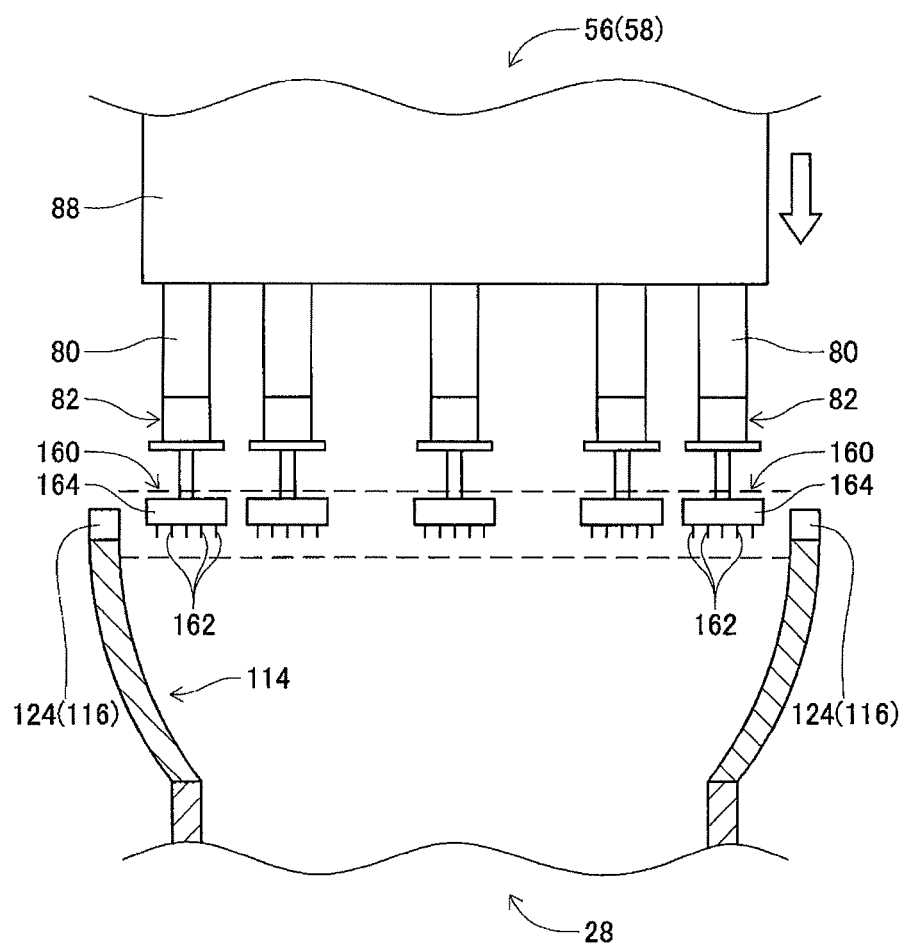
FIG. 10 illustrates operation of a work head during imaging of leaded components for the present disclosure.

Further, for leaded component 150 described above, the leading ends of leads 154 are imaged, and the position coordinates of the leading ends of leads 154 are calculated; however, with a leaded component 160 such as a connector or a socket with short leads (see FIG. 10), the lower surface of the component main body is imaged, and the position coordinates of the leading ends of the leads are calculated based on the image data. In detail, as shown in FIG. 10, leaded components 160 with short leads 162 such as connectors or sockets are picked up and held by suction nozzles 82 using component main body 164.

Then, work head 56, 58 holding the multiple leaded components 160 by the multiple suction nozzles 82 moves above component camera 28 by the operation of X-direction moving device 63 and Y-direction moving device 64, and then moves down by the operation of Z-direction moving device 65. Here, operation of Z-direction moving device 65 is controlled such that the lower surface of component main body 164 of leaded components 160 held by suction nozzles 82 falls within the depth of field (indicated by the dotted line in the drawing) of imaging device 110.

The depth of field refers to the range of the distance between the camera and the target object for which the target object is in focus, and is also referred to as the imaging depth. Therefore, the depth of field of imaging device 110 includes the irradiation range of side lighting 116 described above, and is larger than the irradiation range of side lighting 116. Further, when imaging leaded components 160, at component camera 28, side lighting 116 is off, and light is irradiated upwards by incident lighting 114. Thus, incident lighting 114 illuminates the lower surface of component main body 164 of leaded component 160 that has been lowered to the depth of field of imaging device 110 above component camera 28.

The light from incident lighting 114 is reflected by the lower surface of component main body 164 of leaded component 160 and the reflected light enters imaging device 110. Here, reflected light from the lower surface of component main body 164 of the multiple leaded components 160 held by the multiple suction nozzles 82 enters imaging device 110. As a result, imaging device 110 collectively images component main body 164 of the multiple leaded components 160 held by the multiple suction nozzles 82. Then, controller 140 calculates the positional coordinates in the X and Y directions of the component main body 164 of the multiple leaded components 160 held by the multiple suction nozzles 82 based on the image data obtained by the imaging.

Further, memorized in controller 140 is information related to the relative positions of component main body 164 and leads 162 of leaded component 160. Thus, controller 140 calculates the position coordinates of the leading ends of leads 162 of the multiple leaded components 160 held by the multiple suction nozzles 82 in the X and Y directions based on the position coordinates of component main body 164 in the X and Y directions. In this manner, with component mounter 10, the tact time is shortened by capturing an image of the multiple leaded components 160 collectively not only when imaging using reflected light of side lighting 116 but also when imaging using reflected light of side lighting 114.

Note that, controller 140, as shown in FIG. 6, includes first lowering instruction section 170, first imaging instruction section 172, first calculating section 174, second lowering instruction section 176, second imaging instruction section 178, and second calculating section 180. First lowering instruction section 170 is a functional section for lowering work head 56, 58 during imaging using the reflected light of side lighting 116. First imaging instruction section 172 is a functional section for imaging using reflected light of side lighting 116. First calculating section 174 is a functional section for calculating the position of the leading end of leads 154 of leaded component 150 during imaging using reflected light of side lighting 116. Second lowering instruction section 176 is a functional section for lowering work head 56, 58 during imaging using reflected light of incident lighting 114. Second imaging instruction section 178 is a functional section for imaging using reflected light of incident lighting 114. Second calculating section 180 is a functional section for calculating the position of component main body 164 of leaded component 160 during imaging using reflected light of incident lighting 114.

Note that, component mounter 10 is an example of a work machine. Component camera 28 is an example of an imaging device. Control device 36 is an example of a control device. Work heads 56 and 58 are examples of a holding head. Work head moving device 62 is an example of a moving device. Suction nozzle 82 is an example of a component holding tool. Unit raising and lowering device 96 is an example of a holding tool moving mechanism. Incident lighting 114 is an example of incident lighting. Side lighting 116 is an example of side lighting. Laser light 124 is an example of a light source. Leaded component 150 is an example of a component. Lead 154 is an example of a lead. Leaded component 160 is an example of a component. The lower surface of the component main body 164 is an example of an imaged surface. First lowering instruction section 170 is an example of a first lowering instruction section. First imaging instruction section 172 is an example of a first imaging instruction section. First calculating section 174 is an example of a first calculating section. Second lowering instruction section 176 is an example of a second lowering instruction section. Second imaging instruction section 178 is an example of a second imaging instruction section. Second calculating section 180 is an example of a second calculating section. The process executed by first lowering instruction section 170 is an example of a lowering process. The process executed by the first imaging instruction unit 172 is an example of an imaging process. The process executed by the first calculating section 174 is an example of a calculating process.

Further, the present disclosure is not limited to the above example embodiments, and various changed or improved methods of embodiment are possible based on the knowledge of someone skilled in the art. Specifically, for example, in an embodiment above, descriptions are given of a case in which eight suction nozzle 82 hold eight leaded components 150, 160; however, the present disclosure can also be applied to cases where two or more of eight suction nozzles 82 hold two or more leaded components 150, 160.

Further, in an embodiment above, a case is described in which the multiple suction nozzles 82 hold the same type of leaded component, but the present disclosure can also be applied to a case in which the multiple suction nozzles 82 hold multiple types of leaded components. In detail, for example, in a case in which the multiple suction nozzles 82 hold A-type leaded components and B-type leaded components, work head 56, 58 may be lowered such that the leading ends of leads of A-type components enter the lighting range of side lighting 116, then the leading ends of leads of A-type leaded components may be imaged. Then, when imaging of A-type leaded components is complete, work head 56, 58 may be lowered such that the leading ends of leads of B-type components enter the lighting range of side lighting 116, then the leading ends of leads of B-type leaded components may be imaged. By imaging the leaded components in this manner, even when the multiple suction nozzles 82 hold multiple types of leaded components, each of the multiple types of leaded components can be imaged collectively.

REFERENCE SIGNS LIST

10: component mounter (work machine);
28: component camera (imaging device);
36: control device;
56: work head (holding head);
56: work head (holding head);
62: work head moving device (moving device);
82: suction nozzle (component holding tool);
96: unit raising and lowering device (holding tool moving mechanism);
114: incident lighting;
116: side lighting;
124: laser light (light source);
150: leaded component (component);
154: lead;
150: leaded component (component);
164: component main body (imaged surface);
170: first lowering indicator section (lowering process);
172: first imaging instruction section (imaging process);
174: first calculating section (calculation process);
176: second lowering indicator section;
178: second imaging instruction section;
180: second calculating section

The invention claimed is:
1. A work machine comprising:
a holding head provided with multiple component holding tools, the component holding tools including four suction nozzles equally spaced on a first circumference;
a moving device configured to move the holding head in a horizontal plane direction and a vertical direction;
a holding head rotating device configured to rotate the holding head;
an imaging device provided with side lighting configured to emit light from a side direction onto leads of the components held by the component holding tools, the side lighting including four light sources that are evenly spaced on a second circumference; and
a control device including a processor configured to perform a series of operations including
lowering the holding head such that the leads of at least two components held by at least two of the multiple component holding tools enter a lighting range of the side lighting, and rotating the holding head such that the four suction nozzles face the four light sources in a first direction and a second direction perpendicular to each other, the first direction and the second direction being perpendicular to the vertical direction,
collectively imaging the leads of the at least two components based on reflected light of the side lighting that is reflected by the leads of the components, and
raising the holding head, and
calculate a position of the leads of the at least two components based on the collective imaging,
wherein the series of operations is performed only once to calculate the position of the leads of the at least two components.
2. The work machine according to claim 1, wherein the series of operations include lowering the holding head such that the leads of the multiple components held by all of the multiple component holding tools enter the lighting range of the side lighting, and collectively imaging the leads of the multiple components based on reflected light of the side lighting that is reflected by the leads of the components, and the control device is configured to calculate positions of the multiple leads based on the collective imaging.

3. The work machine according to claim 1, wherein the imaging device is provided with incident lighting configured to emit light from below onto the components held by the component holding tools, and the control device is configured to lower the holding head such that an imaged surface of at least two of the components held by at least two of the multiple holding tools enters a depth of field of the imaging device above the incident lighting, image the imaged surface of the at least two components based on reflected light of the incident lighting that is reflected by the imaged surface of the components, and calculate a position of the imaged surface of the at least two components based on image data of the imaged surface.

4. The work machine according to claim 1, wherein the holding head is provided with a holding tool moving mechanism configured to move each of the component holding tools in a vertical direction.

5. A calculation method for calculating a position of the lead of a component held by a component holding tool in a work machine provided with a holding head provided with multiple component holding tools, the component holding tools including four suction nozzles equally spaced on a first circumference, a moving device configured to move the holding head in a horizontal plane direction and a vertical direction, a holding head rotating device configured to rotate the holding head, an imaging device provided with side lighting configured to emit light from a side direction onto leads of the components held by the component holding tools, the side lighting including four light sources that are evenly spaced on a second circumference, the calculation method comprising:

performing a series of operations including lowering the holding head such that the leads of at least two components held by at least two of the multiple component holding tools enter a lighting range of the side lighting, and rotating the holding head such that the four suction nozzles face the four light sources in a first direction and a second direction perpendicular to each other, the first direction and the second direction being perpendicular to the vertical direction;

collectively imaging the leads of the at least two components based on reflected light of the side lighting that is reflected by the leads of the components; and raising the holding head; and calculating a position of the leads of the at least two components based on image data imaged in the collective imaging, wherein the series of operations is performed only once to calculate the position of the leads of the at least two components.

* * * * *